(12) United States Patent
Bayan

(10) Patent No.: US 7,944,032 B2
(45) Date of Patent: May 17, 2011

(54) INTEGRATED CIRCUIT PACKAGE WITH MOLDED INSULATION

(75) Inventor: Jaime A. Bayan, San Francisco, CA (US)

(73) Assignee: National Semiconductor Corporation, Santa Clara, CA (US)

(*) Notice: Subject to any disclaimer, the term of this patent is extended or adjusted under 35 U.S.C. 154(b) by 131 days.

(21) Appl. No.: 12/558,431

(22) Filed: Sep. 11, 2009

(65) Prior Publication Data

US 2010/0001383 A1    Jan. 7, 2010

Related U.S. Application Data

(62) Division of application No. 11/614,281, filed on Dec. 21, 2006, now Pat. No. 7,608,482.

(51) Int. Cl.
*H01L 23/495* (2006.01)

(52) U.S. Cl. ............... 257/670; 257/E23.043; 257/666; 438/112

(58) Field of Classification Search .......... 257/E23.031, 257/E23.043, E21.502, E23.037, E23.046, 257/666, 670, 678, 737, 738; 438/111, 112, 438/123, 124, 131, 613
See application file for complete search history.

(56) References Cited

U.S. PATENT DOCUMENTS

| | | | |
|---|---|---|---|
| 4,779,835 A | 10/1988 | Fukushima et al. | 249/161 |
| 6,025,640 A | 2/2000 | Yagi et al. | 257/666 |
| 6,130,473 A | 10/2000 | Mostafazadeh et al. | 257/666 |
| 6,132,529 A | 10/2000 | Hatakeyama et al. | 148/435 |
| 6,229,200 B1 | 5/2001 | Mclellan et al. | 257/666 |
| 6,242,281 B1 | 6/2001 | Mclellan et al. | 438/106 |
| 6,281,568 B1 | 8/2001 | Glenn et al. | 257/684 |
| 6,348,726 B1 | 2/2002 | Bayan et al. | 257/666 |
| 6,384,472 B1 | 5/2002 | Huang | 257/680 |
| 6,424,027 B1 | 7/2002 | Lamson et al. | 257/676 |
| 6,429,508 B1 | 8/2002 | Gang | 257/678 |
| 6,433,277 B1 | 8/2002 | Glenn | 174/52.4 |
| 6,455,356 B1 | 9/2002 | Glenn et al. | 438/123 |
| 6,521,987 B1 | 2/2003 | Glenn et al. | 257/684 |
| 6,545,229 B1 | 4/2003 | Ma et al. | 174/263 |
| 6,613,607 B2 | 9/2003 | Janssen et al. | 438/110 |
| 6,630,728 B2 | 10/2003 | Glenn | 257/670 |
| 6,650,020 B2 | 11/2003 | Yamada et al. | 257/783 |
| 6,674,156 B1 | 1/2004 | Bayan et al. | 257/670 |
| 6,713,322 B2 | 3/2004 | Lee | 438/123 |
| 6,777,788 B1* | 8/2004 | Wan et al. | 257/670 |

(Continued)

OTHER PUBLICATIONS

Office Action dated Oct. 8, 2009 from U.S. Appl. No. 11/849,430.

(Continued)

*Primary Examiner* — Chris Chu
(74) *Attorney, Agent, or Firm* — Beyer Law Group LLP

(57) ABSTRACT

A variety of improved arrangements and processes for packaging integrated circuits are described. More particularly, methods of encapsulating dice in lead frame based IC packages are described that facilitate covering some portions of the bottom surface of the lead frame while leaving other portions of the bottom surface of the lead frame exposed. In some embodiments, a method of encapsulating integrated circuits mounted on a lead frame panel is described. The lead frame panel includes a plurality of leads having associated contacts and supports. A shim having a plurality of cavities is positioned under the lead frame such that the cavities are adjacent to the supports and not adjacent to the contacts. During the encapsulation process, encapsulant material flows under the supports such that the bottom surfaces of the supports are electrically insulated by the encapsulant while the bottom surfaces of the contacts remain exposed.

22 Claims, 9 Drawing Sheets

U.S. PATENT DOCUMENTS

| | | | |
|---|---|---|---|
| 6,812,125 B1 | 11/2004 | Mostafazadeh | 438/613 |
| 6,849,944 B2 | 2/2005 | Murtuza et al. | 257/734 |
| 6,882,035 B2 * | 4/2005 | Tatt et al. | 257/676 |
| 6,909,166 B2 | 6/2005 | Frezza et al. | 257/666 |
| 7,087,986 B1 * | 8/2006 | Bayan et al. | 257/676 |
| 7,102,209 B1 * | 9/2006 | Bayan et al. | 257/666 |
| 7,259,460 B1 | 8/2007 | Bayan | 257/728 |
| 7,262,491 B2 * | 8/2007 | Islam et al. | 257/670 |
| 7,338,841 B2 * | 3/2008 | Lau | 438/124 |
| 7,410,834 B2 | 8/2008 | Fukaya et al. | 438/123 |
| 7,507,606 B2 | 3/2009 | Ito et al. | 438/123 |
| 7,678,617 B1 * | 3/2010 | Bayan | 438/123 |
| 2002/0109214 A1 | 8/2002 | Minamio et al. | 7/676 |
| 2002/0136872 A1 | 9/2002 | Furuta et al. | 428/200 |
| 2002/0168796 A1 * | 11/2002 | Shimanuki et al. | 438/106 |
| 2003/0006055 A1 * | 1/2003 | Chien-Hung et al. | 174/52.1 |
| 2003/0071333 A1 | 4/2003 | Matsuzawa | 257/676 |
| 2005/0016750 A1 | 1/2005 | Zimmerman | 174/52.3 |
| 2008/0211068 A1 * | 9/2008 | Chen et al. | 257/666 |
| 2008/0251898 A1 | 10/2008 | Itou et al. | 257/666 |
| 2011/0057298 A1 * | 3/2011 | Ramos et al. | 257/667 |

OTHER PUBLICATIONS

Office Action dated Jan. 8, 2010 from U.S. Appl. No. 11/849,430.
Notice of Allowance dated Sep. 2, 2009 from U.S. Appl. No. 11/614,281.

* cited by examiner

INTEGRATED CIRCUIT PACKAGE WITH MOLDED INSULATION

CROSS REFERENCE TO RELATED APPLICATIONS

The following application is a Divisional of U.S. patent application Ser. No. 11/614,281 entitled INTEGRATED CIRCUIT PACKAGE WITH MOLDED INSULATION, filed on Dec. 21, 2006, which is herein incorporated in its entirety by reference.

BRIEF DESCRIPTION OF THE INVENTION

The present invention generally relates to the packaging of integrated circuits (ICs). More particularly, methods of encapsulating dice in lead frame based IC packages are described that facilitate covering some portions of the bottom surface of the lead frame while leaving other portions of the bottom surface of the lead frame exposed.

BACKGROUND OF THE INVENTION

There are a number of conventional processes for packaging integrated circuits. Many packaging techniques use a lead frame that has been stamped or etched from a metal (typically copper) sheet to provide electrical interconnects to external devices. One relatively recently developed package style is a micro-array package. A lead frame suitable for use in a micro-array style package includes a plurality of leads. Generally, each lead includes a contact post and the leads are etched, half-etched, or otherwise thinned relative to the contact posts. A die is electrically connected to the thinned portions of the leads via bonding wires. Generally, the die, lead frame and bonding wires are then encapsulated while leaving the bottom surfaces of the contact posts exposed to facilitate electrical connection to external devices.

Given their many advantages, micro-array packages have recently generated a great deal of interest within the semiconductor industry. Although existing micro-array lead frame based packaging techniques work well, there are continuing efforts to develop even more efficient designs and methods for packaging integrated circuits using micro-array lead frame technology.

SUMMARY OF THE INVENTION

A variety of improved arrangements and processes for packaging integrated circuits are described. More particularly, methods of encapsulating dice in lead frame based IC packages are described that facilitate covering some portions of the bottom surface of the lead frame while leaving other portions of the bottom surface of the lead frame exposed. Several embodiments of the invention are discussed below.

In one method aspect of the invention, a shim and a populated lead frame panel are positioned in a mold. The lead frame panel has a tape adhered to its bottom surface. The shim has a plurality of cavities. The shim and lead frame panel are arranged such that first portions of the lead frame panel that contact the tape are positioned adjacent selected shim cavities and second portions of the lead frame panel that contact the tape are not positioned adjacent any shim cavities. An encapsulant is injected into the mold to encapsulate dice mounted on the lead frame panel. Some of the encapsulant material displaces the tape in regions within the cavities such that encapsulant material flows under the first portions of the lead frame panel. At the same time, the tape substantially prevents encapsulant material from flowing under the second portions of the lead frame panel.

The described arrangement can be used in the formation of a wide variety of lead frame based packages. By way of example, in micro-array type packages, the described arrangement can be used to electrically insulate portions of the lead frame (such as support posts) that are substantially co-planar with the microarray contact pads.

In a separate aspect of the invention, an improved micro-array lead frame panel is described. In this aspect, the micro-array lead frame panel includes a plurality of device areas, each device area having an array of contact posts. Each contact post is integrally formed from an associated lead segment. The bottom surfaces of the lead segments are recessed relative to the bottom surface of the lead frame panel while the bottom surfaces of the contact posts are substantially coplanar with the bottom surface of the lead frame panel. Additionally, each device area of the micro-array lead frame panel includes a plurality of elongated support segments located peripherally around the array of contact posts. Each elongated support segment is also integrally formed with an associated lead segment and is suitable for use in supporting the associated lead segment during wire bonding or other process steps.

In a separate aspect of the invention, a shim suitable for use in encapsulating integrated circuit packages is described. In this aspect, the shim includes a plurality of shim device areas, each shim device area having one or more shim cavities. The shim cavities are arranged such that when the shim is appropriately positioned adjacent to an associated lead frame panel having a plurality of corresponding lead frame device areas, first portions of the lead frame device areas are positioned adjacent to the shim cavities while second portions of the lead frame device areas are not positioned adjacent to any of the shim cavities.

In yet another aspect of the invention, an integrated circuit package is described. The IC package includes a lead frame having an array of contact posts, a plurality of lead segments and a plurality of supports located peripherally of the array of contact posts. Each contact post and support is integrally formed with an associated lead segment. The bottom surfaces of the lead segments are recessed relative to the bottom surface of the lead frame while the bottom surfaces of the contact posts and supports are substantially coplanar with the bottom surface of the lead frame. The IC package also includes a die that is carried by and electrically connected to the lead frame. The lead frame, die and electrical connections are encapsulated such that the lead segments and supports are not exposed at the bottom surface of the package while the bottom surfaces of the contact posts are exposed at the bottom surface of the package. In this way, the supports are electrically insulated by the encapsulant while the contact posts remain exposed to facilitate electrical connection to an external device.

Other aspects and advantages of the invention will become apparent from the following detailed description taken in conjunction with the accompanying drawings, which illustrate, by way of example, the principles of the invention.

BRIEF DESCRIPTION OF THE DRAWINGS

For a better understanding of the invention, reference should be made to the following detailed description taken in conjunction with the accompanying drawings, in which.

In the drawings, like reference numerals are sometimes used to designate like structural elements. It should also be appreciated that the depictions in the figures are diagrammatic and not to scale.

DETAILED DESCRIPTION OF THE DRAWINGS

The invention relates generally to the packaging of integrated circuits (ICs). More particularly, methods of encapsulating dice in lead frame based IC packages are described that facilitate covering some portions of the bottom surface of the lead frame while leaving other portions of the bottom surface of the lead frame exposed.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Figure 1A:
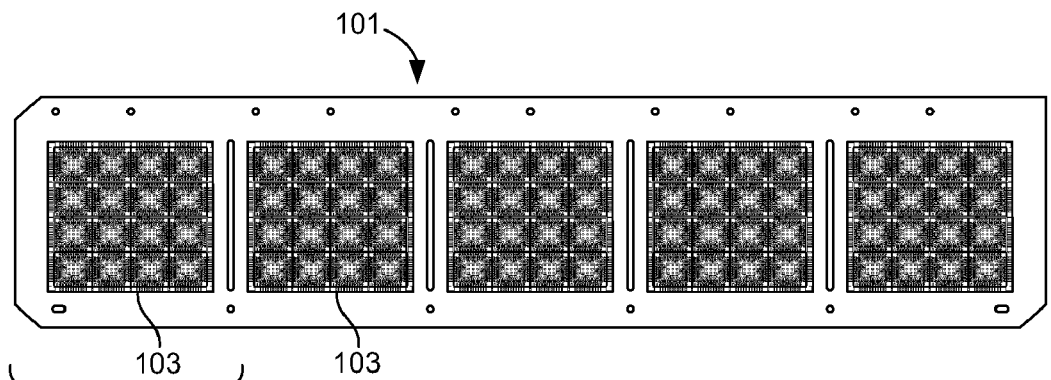
FIG. 1A illustrates a diagrammatic top view of a lead frame panel suitable for use in packaging integrated circuits in accordance with an embodiment of the present invention.

FIG. 1A illustrates a diagrammatic top view of a lead frame panel suitable for use in packaging integrated circuits according to embodiments of the present invention. A lead frame panel 101 can be configured as a metallic (or other conductive) structure having a number of two-dimensional arrays 103 of device areas 105. As illustrated in the successively more detailed FIGS. 1B-C, each device area 105 of the two-dimensional array 103 is configured for use in a single IC package. Additionally, fine tie bars 107 connect the device areas to one another within the array 103. During packaging, one or more semiconductor dice are affixed to each device area 105, where they are then subjected to wire bonding, encapsulation and singulation processes, yielding individual IC packages.

In order to facilitate these processes, each device area 105 has a number of leads 111, each supported at one end by the tie bars 107. During die attach and wire bonding processes, dice are attached to the leadframe and bonding pads on the dice are electrically connected to the leads 111 via bonding wires or other suitable electrical connections.

There are applications, including many analog applications, that necessitate that selected leads carry more current than that which can be reliably carried by a single bonding wire. In applications such as these, two or more bonding wires may be required between a bonding pad on the die and an associated lead on the lead frame. However, the bonding process may be sufficient in many instances to cause the leads to bow or flex excessively, or even to fail.

To mitigate bowing of the leads, supports 115 extending to the bottom surface of the lead frame 101 are positioned under the leads 111 in regions in proximity to where the bonding wires are bonded to the leads. By way of example, the supports 115 may take the form of support posts or elongated support segments. The supports 115 support the leads 111 during wire bonding processes. However, as described in more detail below, the supports may increase the exposed metal surface area on the bottom surface of the package, which may increase the propensity for electrical shorting. It is therefore desirable to electrically insulate the supports 115.

Figure 1B:
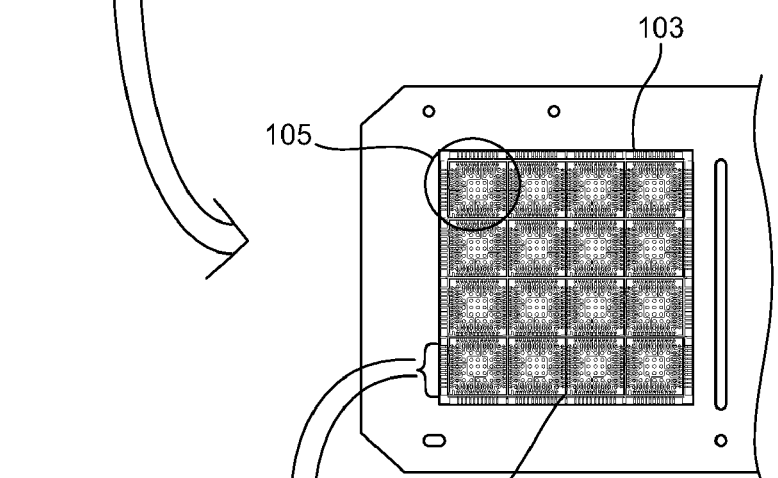
FIGS. 1B-1C illustrate successively more detailed views of selected elements of the lead-frame panel of FIG. 1A.
Figure 1C:
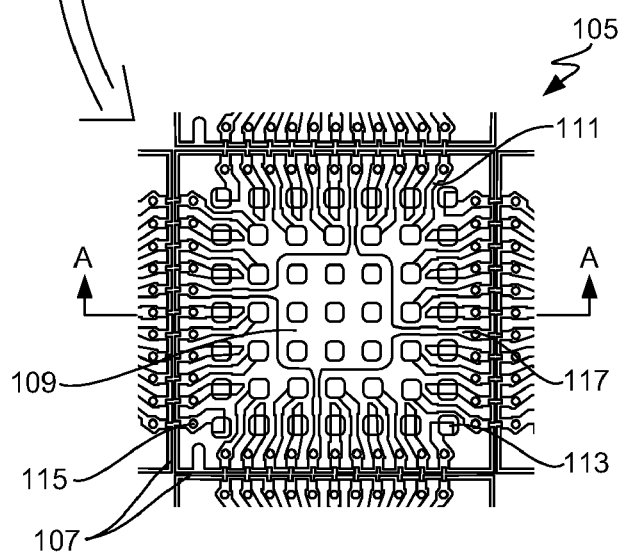
Figure 4A:
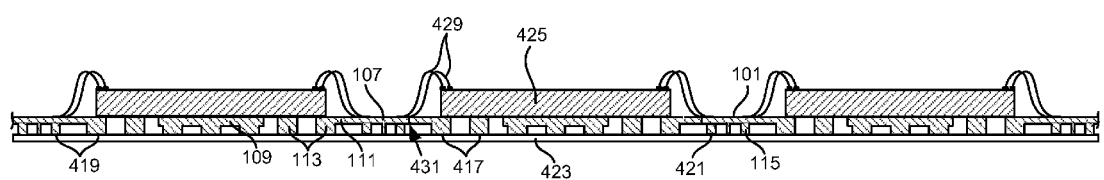
FIGS. 4A-4C illustrate diagrammatic cross-sections of the lead frame panel of FIG. 1A during various stages of packaging in accordance with an embodiment of the present invention.
Figure 4B:
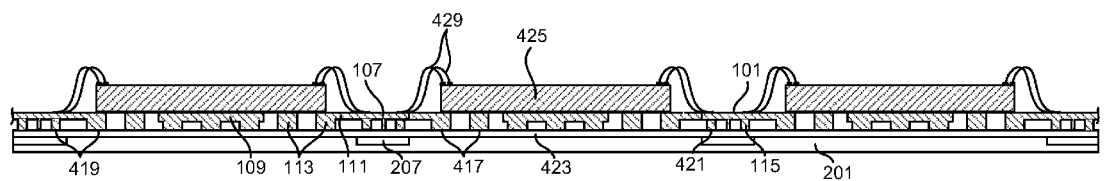
Figure 4C:
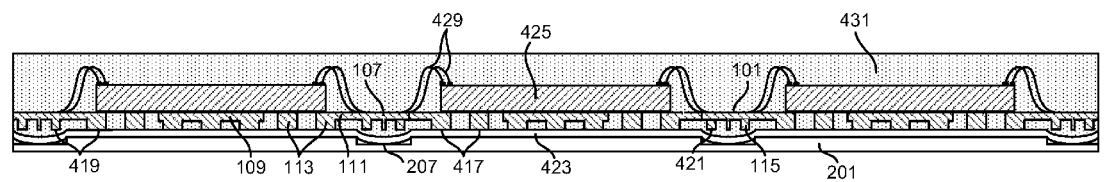

In the embodiment illustrated in FIGS. 1A-C, selected leads 111 include contact posts 113 and supports 115 integrally formed with the selected leads 111. The leads 111 are etched, half-etched, or otherwise thinned relative to the contact posts 113 and supports 115. Each contact post 113 extends to the bottom surface 419 of the lead frame panel 101 to provide a conductive contact pad 417 at the bottom surface of the lead frame. This configuration is best illustrated in FIG. 4A which illustrates a cross section A-A of FIG. 1C after the lead frame 101 has already been subjected to the die attach and wire bond processes, but prior to encapsulation. Each support 115 also extends to the bottom surface 419 of the lead frame 101 to provide a support structure for selected leads 111. In this manner, only bottom surfaces of the contact posts 113 and supports 115 may be coplanar with the bottom surface 419 of the lead frame panel 101. Additionally, as shown in the illustrated embodiment, the supports 115 are arranged peripherally around the device areas 105. It should be appreciated that, in various embodiments, it is not necessary that all of the leads 111 include supports 115.

In various embodiments, the lead frame panel 101 may be configured such that each device area 105 includes a die attach pad or other die support structure 109. In one embodiment, the die attach pad 109 is integrally formed with a plurality of contact posts. In this embodiment, the lead frame panel 101 may further include die attach pad support bars 117 that connect the die attach pads to the tie bars 107. The die attach pad support bars 117 are also recessed relative to the bottom surface 419 of the lead frame panel 101 and may optionally include integral supports 115.

The described lead frames are suitable for use in microarray style packages, although the invention may be practiced with other lead frames suitable for use in alternative package styles. As will be explained below, the devices may be encapsulated in a manner such that the contact pads 417 remain exposed at the bottom surface 419 of the encapsulated lead frame panel 101 while the bottom surfaces 421 of the supports 115 are not exposed at the bottom surface 419 of the encapsulated lead frame panel 101.

Figure 5A:
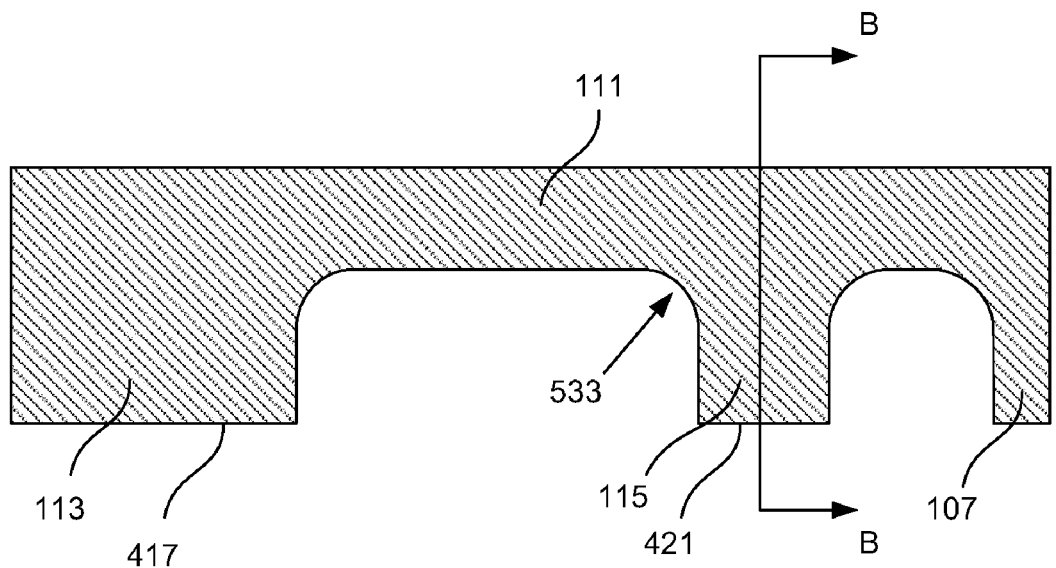
FIGS. 5A-5B illustrate diagrammatic cross-sections of a lead in accordance with an embodiment of the present invention.
Figure 5B:
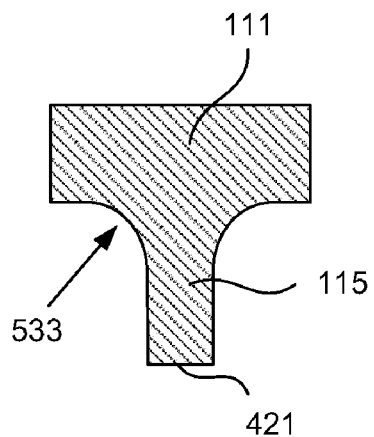
Figure 6A:
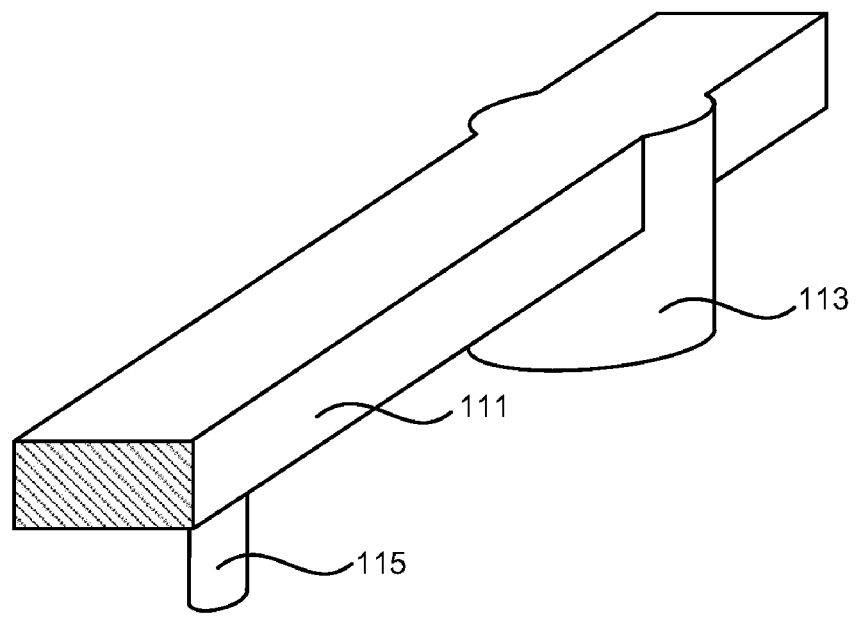
FIGS. 6A-6B illustrate diagrammatic three-dimensional renditions of leads in accordance with other embodiments of the present invention.
Figure 6B:
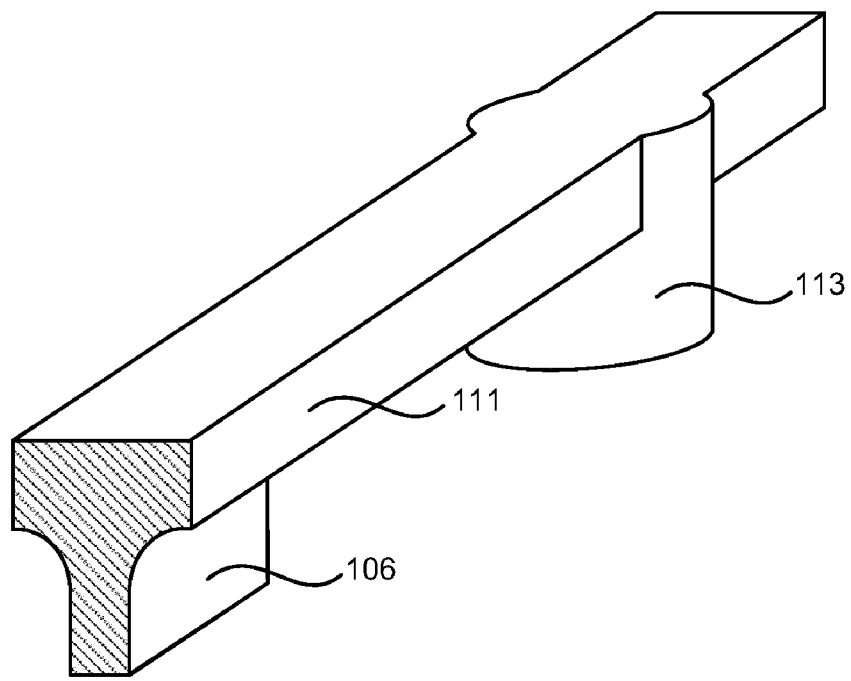

In some of the illustrated embodiments, the supports 115 have substantially circular cross-sections, as observed in FIG. 6A. However, it should be appreciated by those skilled in the art that the supports 115 may assume a variety of shapes having varying cross-section geometries. By way of example, the supports 115 may take the form of columns having ovular or rectangular cross-sections. In a 11 particularly preferred embodiment, each support 115 takes the form of an elongated support segment extending along a portion of an associated lead 111. Additionally, the leads may be etched or thinned such that fillets 533 are formed between the supports 115 and leads 111, contact posts 113 and leads, and/or the tie bars 107 and leads, as is illustrated in FIG. 5A. Representative fillets 533 may be observed in FIG. 5B, which illustrates cross-section B-B of FIG. 5A. Furthermore, the tie bars 107 may be etched such that integral ribs are formed beneath the tie bars, which aid in reinforcing the tie bars while reducing the amount of material that the dicing saws must saw through during singulation processes. In a similar fashion, the leads 111 may be etched or thinned so as to form ribs 106, as best observed in FIG. 6B, extending to the bottom surface of the lead frame panel 101. In this manner, the ribs 106 serve as elongated support segments 115. Furthermore, the elongated support segments 115 may extend all of the way to the tie bars 107 such that the elongated support segments 115 are integrally formed with the tie bars 107 (and when appropriate, the ribs of the tie bars).

Figure 2A:
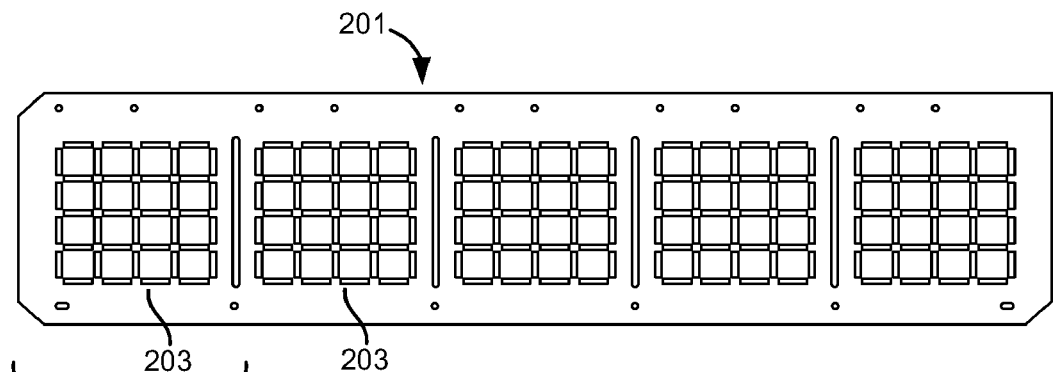
FIG. 2A illustrates a diagrammatic top view of a shim suitable for use in conjunction with the lead frame panel of FIG. 1A in packaging integrated circuits in accordance with an embodiment of the present invention.
Figure 2B:
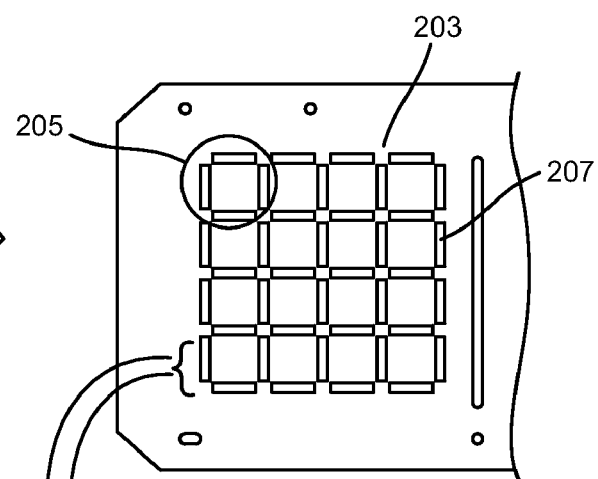
FIGS. 2B-2C illustrate successively more detailed views of selected elements of the shim of FIG. 2A.
Figure 2C:
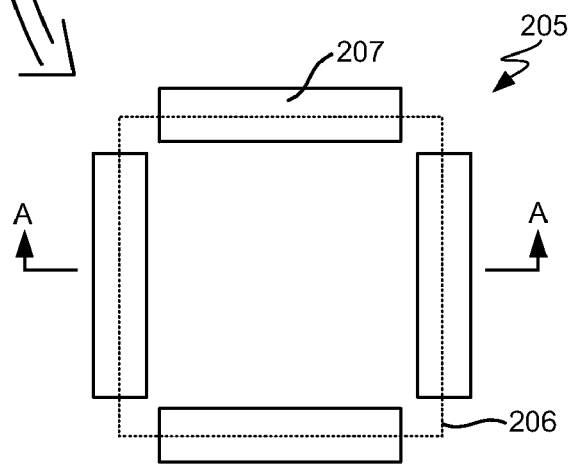

FIG. 2A illustrates a diagrammatic top view of a shim suitable for use in packaging integrated circuits according to embodiments of the present invention. A shim panel 201 may be configured as a metallic structure with a number of two dimensions arrays 203 of device areas 205. As illustrated in the successively more detailed FIGS. 2B-C, each device area 205 of the two-dimensional array 203 is configured for use in encapsulating a single IC package. Each device area 205, as marked by the dotted line 206 in FIG. 2C, includes one or more cavities 207. In various embodiments, adjacent device areas 205 may share a cavity 207, as is shown in FIG. 2C. Each cavity 207 may be in the form of a recessed region formed by etching, half-etching, or otherwise processing a portion of the shim 201. By way of example, substantially rectangular cavities having depths of approximately 70 um have been shown to work well. In alternate embodiments, cavities 207 may be in the form of through-holes formed, by way of example, through etching, stamping, or otherwise processing portions of the shim 201.

During packaging, an adhesive tape 423 is attached to the bottom surface of the lead frame panel 101. Subsequently, one or more semiconductor dice 425 are affixed to each device area 105, where they are then subjected to known die attach and wire bonding processes. By way of example, bottom surfaces of the dice 425 may be adhesively attached to die attach pads 109 by means of a suitable die attach material or an adhesive tape. Bond pads on the dice may be electrically connected to associated leads by conventional interconnect processes such as wire bonding. In some applications, it may be desirable to bond multiple wires 429 to a single lead 111. The supports 115 provide support for the leads such that the stresses of wire bonding operations do not cause the leads to flex or bow excessively, or otherwise fail.

Figure 3A:
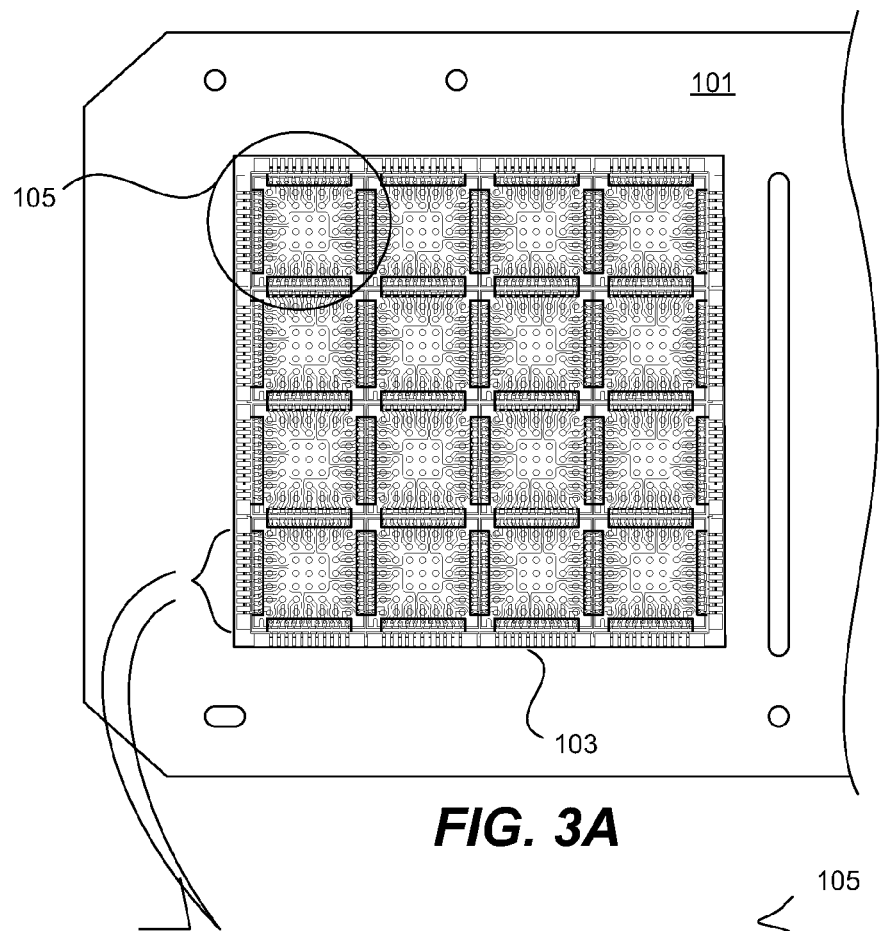
FIGS. 3A-3B illustrate the lead frame panel of FIGS. 1B-1C overlaid on the shim of FIGS. 2B-2C.
Figure 3B:
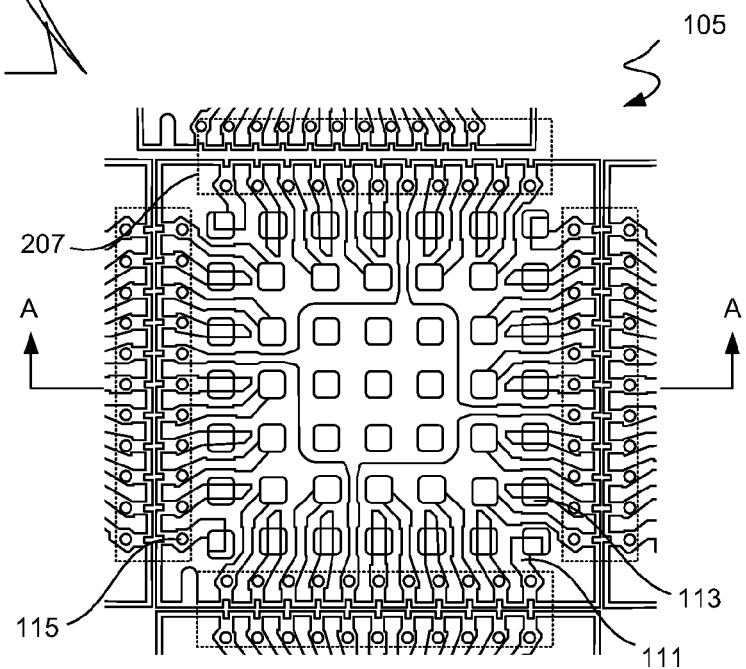

To facilitate encapsulation, a shim 201 and a populated lead frame panel are placed in a molding cavity. As illustrated in FIGS. 3A-3C and 4B-4C, the lead frame panel 101 is placed on top of the shim such that the supports 115 are laid over associated cavities 207 in the shim. In the illustrated embodiment, the two dimensional arrays 103 and 203, and corresponding device areas 105 and 205 on the lead frame panel and shim have substantially the same footprint such that the device areas 105 of the lead frame panel each overlay a corresponding shim device area 205. This is shown in FIGS. 3A-B, which illustrate a top view of the lead frame panel 101 laid over the shim 201. It should be noted that lines corresponding to the shim are dotted, but remain illustrated in FIGS. 3A-3B, to indicate that the lead frame is placed over the shim. In the illustrated embodiment, the shim cavities 207 are sized and positioned such that two rows of supports 115 corresponding to two adjacent device areas 105 are placed over a single rectangular shim cavity 207, as best seen in FIG. 3C. Thus, the shim cavity 207 underlies a segment of a tie bar and the supports 115 associated with the leads carried by the tie bar. However, it should be appreciated that the cavities 207 may be designed such that a lesser number of supports 115 may correspond to and be placed adjacent a single shim cavity 207. It should also be noted that in the illustrated embodiment, the shim cavities 207 do not underlie the regions where the tie bars 107 intersect.

Figure 7:
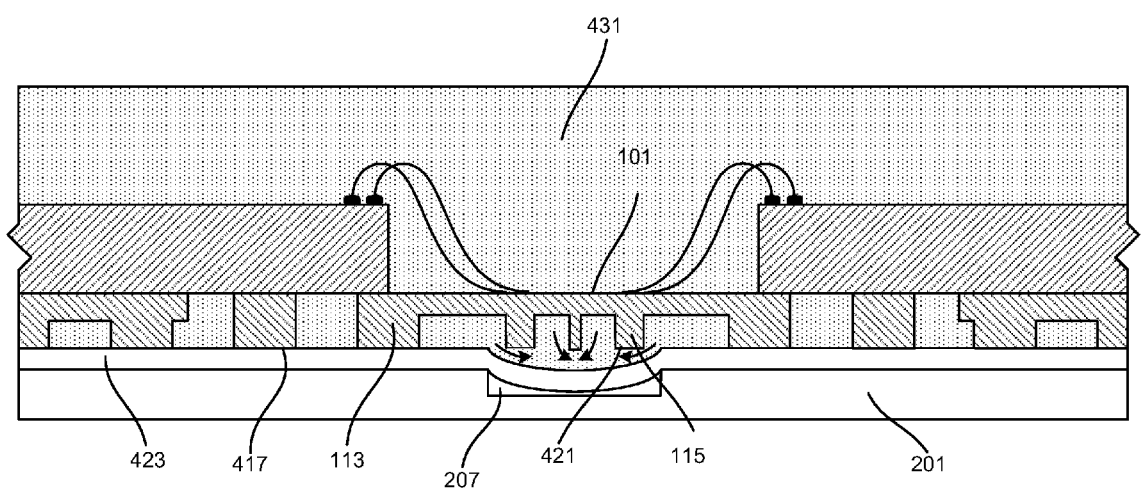
FIG. 7 illustrates a more detailed view of a portion of the lead frame panel of FIG. 4C highlighting the separation of the tape from portions of the lead frame panel overlying the shim cavities during encapsulation.
Figure 8:
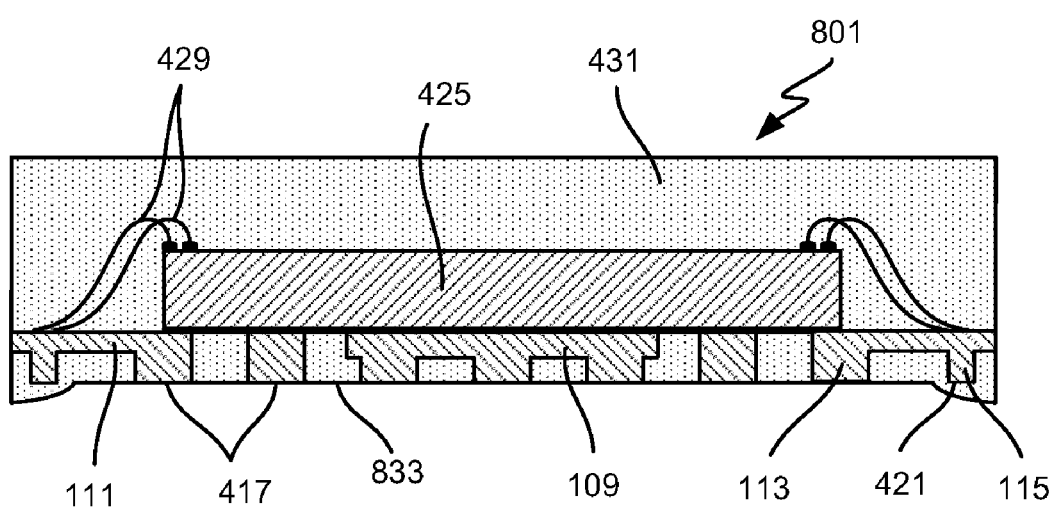
FIG. 8 illustrates a diagrammatic cross-section of a packaged IC formed in accordance with an embodiment of the present invention.

After the shim and lead frame panel have been placed in a mold, the lead frame panel may be encapsulated using conventional molding techniques. As will be appreciated by those familiar with the art, during molding, an encapsulant material is forced into the molding cavity at an elevated temperature and pressure. The pressure is sufficiently great that the liquid encapsulant displaces the tape 423 in regions over the cavities 207. The displacement allows liquid encapsulant material to flow under the support posts 115, as observed in FIG. 4C and FIG. 7, which is a magnified view of FIG. 4C. Once removed from the molding cavity, the tape 423 may be removed from the lead frame panel at any suitable time. In this manner, a layer of hardened encapsulant 431 is formed around the supports 115 such that the bottom surfaces 421 of the supports are not exposed on the bottom surface of the encapsulated lead frame. By way of example, insulating layers of encapsulant having peak thicknesses in the range of approximately 50 to 100 _m are readily obtainable. By way of example, in some tests, insulating layers on the order of 68-70 _m have been formed and have been shown to work well. Such an insulating layer was formed using cavities having a depth of approximately 70 _m and a tape 423 having a thickness of approximately 35 _m.

It should be appreciated that since bottom surfaces 417 of the contact posts 113 are not adjacent the shim cavities 207 during encapsulation, the liquid encapsulant is unable to displace the tape in regions around the contact posts, thus the bottom surfaces of the contact posts remain substantially uncovered by the encapsulant and exposed on the bottom surface of the encapsulated lead frame.

When the cavities 207 are sized and positioned according to the embodiment illustrated in FIG. 3C, in which the cavities do not underlie the tie bar intersections, then regions where the tie bars 107 cross will also remain substantially exposed on the bottom surface of the lead frame. Having visible tie bar intersections may be beneficial in singulation and inspection processes.

After the molding operation, the lead frame panel may be singulated using conventional singulation processes. Each resulting IC package 801 includes a semiconductor die 425 that is attached to a lead frame device area 105. Of course, in some alternative embodiments, multiple dice may be placed in each device area. The package 801 also has bonding wires 429 that electrically connect the die 425 to the leads 111. Typically, the bonding wires are coupled to the leads in the vicinity of the supports 115, although this is not always a requirement. An encapsulant 431 surrounds the die 425 and lead frame 105, leaving only the contact pads 417 exposed at the bottom surface 833 of the IC package. Typically, electrical connectors (e.g., solder balls, solder paste, etc) are attached to the contact pads 417, although this is not a requirement.

It should be noted, that in practice, the shim may remain in the mold such that it may be used in encapsulating other lead frames. Additionally, in an alternate embodiment, the mold itself may be configured so as to have recessed cavities such that the shim is unnecessary. However, considering the great expense of molds and that custom molds would have to be developed for all package styles and configurations, in the interests of costs, versatility and reducing error, it is desirable to produce relatively inexpensive custom shims that fit a general mold, rather than to produce custom molds.

Method of Fabrication

Figure 9:
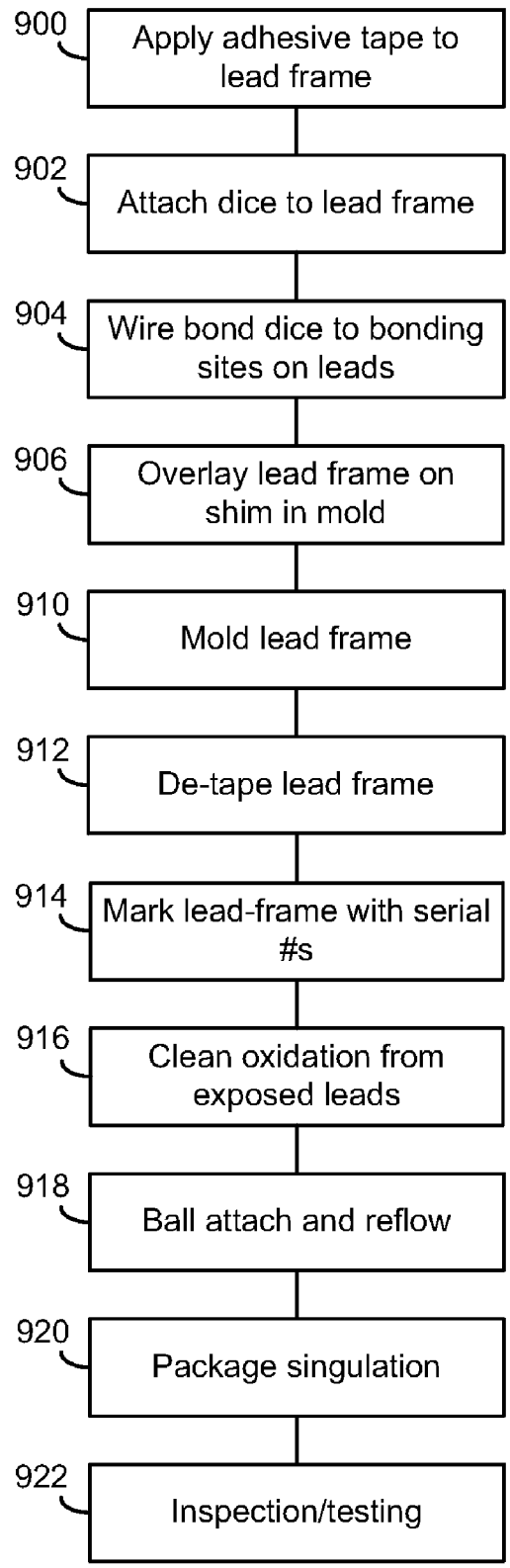
FIG. 9 is a flow chart illustrating a process for fabricating IC packages in accordance with an embodiment of the present invention.

A method of fabricating IC packages in accordance with embodiments of the present invention is now described. FIG. 9 illustrates process steps taken in the fabrication of such packages 801 as described earlier.

The process begins at 900 with applying an adhesive tape to the bottom surface of a lead frame panel having a number of device areas, each of which is suitable for use in an IC package. In one embodiment, each lead frame device area may be suitable for use in a micro-array style IC package. In such a micro-array style lead frame panel, each device area includes a plurality of leads. Selected leads include contacts that are substantially co-planar with the bottom surface of the lead frame panel, as well as a plurality of support posts (supports) that are also substantially co-planar with the bottom surface of the lead frame panel. In this manner, both the bottom surfaces of the contact posts and support posts are in contact with the adhesive tape.

At 902, one or more dice are attached to the lead frame panel via known die attach techniques. The dice are then wire bonded to associated bonding sites on the leads at 904. It should be noted that it is specifically contemplated that multiple wires may be bonded to a single lead. Such a need for multiple wires often arises in analog device applications requiring greater current than which can be reliably carried by a single wire.

The lead frame panel including the bonded dice is then laid in a mold over a shim at 906, such that the top surface of the shim is in contact with the adhesive tape, which is, in turn, adhesively attached to the bottom surface of the lead frame. The shim includes a plurality of cavities that are spaced and sized to correspond to designated first portions of the lead frame, while designated second portions of the lead frame are not positioned adjacent to any shim cavities. In one preferred embodiment, the supports are among the first portions and the contact posts are among the second portions. The lead frame and shim are then subjected to known encapsulation techniques such as injection molding at 910. The encapsulant or molding material is forced into the mold using conventional molding techniques. The pressure is sufficiently great that the liquid encapsulant displaces the tape in regions over the cavities, while not displacing the tape in regions over the land areas of the shim (i.e. in regions that are not adjacent the cavities). The displacement allows liquid encapsulant material to flow under the first portions of the lead frame (supports), while the tape and shim prevents the encapsulant from flowing under the second portions of the lead frame (contacts).

Once removed from the molding cavity, the tape may optionally be removed at step 912. In this manner, an insulating layer of hardened encapsulant is formed around the supports such that the supports are not exposed on the bottom surface of the encapsulated lead frame. By way of example, insulating layers of encapsulant having peak thicknesses in the range of approximately 50 to 100 _m are readily obtainable. By way of example, in some tests, insulating layers on the order of 68-70 _m have been formed and have been shown to work well. Such an insulating layer was formed using cavities having a depth of approximately 70 _m and a tape 423 having a thickness of approximately 35 _m. Conversely, bottom surfaces of the contact posts, which are not positioned adjacent the shim cavities during encapsulation, remain uncovered by the encapsulant and exposed on the bottom surface of the encapsulated lead frame.

Once the lead frame is encapsulated, serial numbers or other identification numbers can be imprinted on the outer surface of the encapsulation material at step 914, and the solder balls or other connectors may be attached. If solder-based connectors are employed, any oxidation may first be cleaned from the contact pads at 916. The surfaces of the contact pads are then treated appropriately, such as by application of Ni—Au plating if desired, or in some embodiments, simple cleaning with no other application of material to the pads. Solder connectors may then be attached to the contact pads by known reflow or ball attach processes at step 918. The individual packages can then be singulated at step 920, where they are then ready for inspection and/or testing at step 922. It should be appreciated that some of the aforementioned steps can be implemented in a differing order. By way of example, the individual packages may be singulated prior to ball attach. The described method of electrically insulating the support posts has been shown to eliminate shorting between support posts having a pitch of less than 0.4 mm.

In an additional embodiment, a similar method may be used to create spacers on the bottom of an IC package. Spacers may be advantageous for packages that necessitate that a space is maintained between the bottom surface of the package and the top surface of the printed circuit board or other substrate to which the package is attached. By way of example, spacers may be particularly useful for land grid array (LGA) packages not employing solder balls. Solder joint reliability, which is generally important for LGA packages, generally improves with an increasing distance between the bottom surface of the package and the top surface of the substrate. Thus, spacers may be used to achieve greater solder joint reliability. The method is virtually identical to that described above. However, rather than positioning the shim cavities adjacent to supports or other exposed portions of a lead frame or other conductive structures, the shim cavities are placed wherever spacers are desired on the bottom surface of a molded package. Such spacers can be formed in packages that have conductive structures exposed on their bottom surface and in packages that do not have conductive structures exposed on their bottom surface.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

In the illustrated embodiment, the cavities were rectangular and were sized such that each cavity could accommodate two entire rows of support posts. However, based on the application and the desired layout of the leads, as well as the tolerances required, other cavity layouts, sizes, and shapes may prove beneficial. For example, the cavities may be circular in shape and each sized for a single support post. Alternatively, the cavities may be ovular in shape and sized for a row of support posts. Edges of the cavities may also be beveled such that the tape is more easily deformed and more displacement is achieved.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A lead frame panel suitable for use in semiconductor packaging, the lead frame panel comprising a matrix of tie bars that define a plurality of device areas, each device area being configured suitably to support an associated die and including:
an array of contact posts, each contact post having a contact pad that is substantially co-planar with a bottom surface of the lead frame panel;
a plurality of lead segments carried by associated tie bars, each lead segment being integrally formed with an associated contact post, wherein upper surfaces of the lead segments are substantially co-planar with an upper surface of the lead frame panel and bottom surfaces of the lead segments are recessed relative to the bottom surface of the lead frame panel, and wherein some of the lead segments extend between contact posts associated with other lead segments; and
a plurality of elongated support segments located peripherally around the array of contact posts, each elongated support segment being integrally formed with an associated lead segment, wherein bottom surfaces of the elongated support segments are substantially co-planar with the bottom surface of the lead frame panel, and wherein each elongated support segment extends along a portion of an associated lead segment but does not extend to an associated contact post such that each elongated support segment is longer than it is wide.

2. A lead frame panel as recited in claim 1, wherein the elongated support segments do not extend to the outermost periphery of their associated device areas.

3. A lead frame panel as recited in claim 1, wherein the elongated support segments extend to the outermost periphery of their associated device areas.

4. A lead frame panel as recited in claim 3, wherein the elongated support segments are integrally formed with associated tie bars.

5. A lead frame panel as recited in claim 1 wherein each device area further includes a die attach pad, the die attach pad being integrally formed with a plurality of the contact posts.

6. A lead frame panel as recited in claim 5 further comprising die attach pad support bars that couple the die attach pads to associated tie bars, the die attach support bars having upper surfaces that are substantially co-planar with the upper surface of the lead frame panel and bottom surfaces that are recessed relative to the bottom surface of the lead frame panel.

7. A lead frame panel as recited in claim 6 wherein at least some of the die attach pad support bars are arranged as lead segments that have associated elongated support segments.

8. A lead frame panel as recited in claim 1 wherein the lead frame panel takes the form of a lead frame strip having a plurality of spaced apart two-dimensional arrays of device areas therein.

9. A lead frame panel as recited in claim 1, wherein the elongated support segments are thinner then portions of their associated lead segments above the elongated support segments.

10. A lead frame panel as recited in claim 9, wherein the elongated support segments curve into their associated lead segments such that fillets are formed at the intersections of the elongated support segments and their associated lead segments.

11. A shim suitable for use in encapsulating integrated circuit packages, comprising:
a plurality of shim device areas; and
a matrix of shim cavities that define the plurality of shim device areas, the shim cavities being suitably sized and positioned such that when the shim is appropriately positioned adjacent to an associated lead frame panel having a plurality of lead frame device areas, first portions of the device areas of the associated lead frame panel are positioned adjacent selected shim cavities and second portions of the device areas of the associated lead frame panel are not positioned adjacent any shim cavities;
wherein during encapsulation of the associated lead frame panel, the shim cavities facilitate covering the first portions of the device areas with encapsulant while the second portions of the device areas are substantially prevented from being covered with encapsulant.

12. A shim as recited in claim 11, wherein the shim cavities are recessed regions in the shim or through-holes in the shim.

13. A shim as recited in claim 11, wherein the lead frame panel takes the form of a lead frame strip having a plurality of spaced apart two-dimensional arrays of device areas therein, and wherein the shim is configured to correspond to an associated one of the plurality of spaced apart two-dimensional arrays of device areas.

14. A shim as recited in claim 11, wherein the shim cavities are arranged peripherally around the shim device areas.

15. A shim as recited in claim 14, wherein adjacent shim device areas share a shim cavity.

16. An integrated circuit package comprising:
a lead frame having an array of contact posts, a plurality of lead segments and a plurality of supports located peripherally of the array of contact posts, each contact post having a contact pad that is substantially co-planar with a bottom surface of the lead frame panel, each lead segment being integrally formed with an associated contact post and each support being integrally formed with an associated lead segment, wherein bottom surfaces of the supports are substantially co-planar with the contact pads and wherein upper surfaces of the lead segments are substantially coplanar with an upper surface of the lead frame and bottom surfaces of the lead segments are recessed relative to the bottom surface of the lead frame, and wherein some of the lead segments extend between contact posts associated with other lead segments; and
a die carried by the lead frame;
a plurality of electrical conductors that electrically connect the die to selected lead segments; and an encapsulant that encapsulates the die, the electrical conductors and the lead segments such that the lead segments and supports are not exposed at the bottom surface of the package while the contact pads are exposed at the bottom surface of the package.

17. A package as recited in claim 16, wherein the supports are elongated support segments, wherein each elongated support segment extends along a portion of an associated lead segment but does not extend to an associated contact post such that each elongated support segment is longer than it is wide.

18. A package as recited in claim 16 wherein the lead frame further includes a die attach pad, the die attach pad being integrally formed with a plurality of the contact posts.

19. A package as recited in claim 18 further comprising a plurality of die attach pad support bars having upper surfaces that are substantially co-planar with the upper surface of the lead frame and bottom surfaces that are recessed relative to the bottom surface of the lead frame, wherein the die is electrically connected to at least one of the die attach pad support bars and the contact posts associated with the die attach pad may be arranged to be electrically active.

20. A package as recited in claim 19 wherein at least one of the die attach pad support bars is arranged as a lead segment that has an associated support.

21. An integrated circuit package as recited in claim 16, wherein the electrical conductors that electrically connect the die to selected lead segments are bonding wires, and wherein at least two bonding wires are bonded to each of one or more selected leads having supports.

22. An integrated circuit package, comprising:
a lead frame having an upper surface and a bottom surface, wherein the bottom surface of the lead frame includes a plurality of support surfaces that are coplanar with the bottom surface of the lead frame and a plurality of contact surfaces that are substantially coplanar with the support surfaces;
a die carried by the lead frame;
a plurality of electrical conductors that electrically connect the die to selected portions of the lead frame; and
an encapsulant that encapsulates the die, the electrical conductors and the lead frame such that the support surfaces are not exposed at the bottom surface of the package while the contact surfaces are exposed at the bottom surface of the package, wherein the encapsulant include protruding mounds that cover the support surfaces.

* * * * *